(12) United States Patent
Noda et al.

(10) Patent No.: US 7,868,398 B2
(45) Date of Patent: Jan. 11, 2011

(54) SEMICONDUCTOR DEVICE

(75) Inventors: Takeshi Noda, Atsugi (JP); Hidehito Kitakado, Tenri (JP); Takuya Matsuo, Tondabeyashi (JP)

(73) Assignees: Semiconductor Energy Laboratory Co., Ltd., Atsugi-shi, Kanagawa-ken (JP); Sharp Kabushiki Kaisha, Osaka-shi (JP)

( * ) Notice: Subject to any disclaimer, the term of this patent is extended or adjusted under 35 U.S.C. 154(b) by 773 days.

(21) Appl. No.: 11/542,217

(22) Filed: Oct. 4, 2006

(65) Prior Publication Data

US 2007/0045730 A1    Mar. 1, 2007

Related U.S. Application Data

(62) Division of application No. 10/941,965, filed on Sep. 16, 2004, now Pat. No. 7,145,210.

(30) Foreign Application Priority Data

Sep. 19, 2003 (JP) ............................. 2003-327729

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................... 257/408; 257/368; 257/382

(58) Field of Classification Search ......... 257/368–377, 257/382–412, 366–72, 347, E29.273
See application file for complete search history.

(56) References Cited

U.S. PATENT DOCUMENTS

| | | | |
|---|---|---|---|
| 5,158,903 A * | 10/1992 | Hori et al. .................... | 257/412 |
| 5,272,357 A | 12/1993 | Morishita | |
| 5,512,770 A * | 4/1996 | Hong .......................... | 257/345 |
| 5,719,065 A | 2/1998 | Takemura et al. | |
| 5,945,711 A | 8/1999 | Takemura et al. | |
| 6,222,238 B1 | 4/2001 | Chang et al. | |
| 6,335,555 B1 | 1/2002 | Takemura et al. | |

(Continued)

FOREIGN PATENT DOCUMENTS

JP    06-075247 A    3/1994

(Continued)

*Primary Examiner*—Cuong Q Nguyen
(74) *Attorney, Agent, or Firm*—Eric J. Robinson; Robinson Intellectual Property Law Office, P.C.

(57) ABSTRACT

A semiconductor device, which can improve the effect of a hydrogenation treatment in case of using a GOLD structure, and a method of manufacturing thereof is provided. A gate insulating film is formed on a semiconductor layer, and a source region, a drain region, and LDD regions are formed in the semiconductor layer. A main gate is formed on the gate insulating film. A sub-gate is formed on the main gate and the gate insulating film so as to cover a part of the main gate and either the LDD regions adjacent to the source region or the drain region. An interlayer insulating film containing hydrogen is formed on the sub-gate, main gate, and gate insulating film. Subsequently, a heat treatment for hydrogenation is performed to terminate a crystal defect of the semiconductor layer with hydrogen.

2 Claims, 11 Drawing Sheets

U.S. PATENT DOCUMENTS

| | | |
|---|---|---|
| 6,486,056 B2 | 11/2002 | Pasch et al. |
| 6,639,265 B2 | 10/2003 | Arao et al. |
| 6,835,607 B2 | 12/2004 | Takemura et al. |
| 7,170,138 B2 | 1/2007 | Takemura et al. |
| 7,301,209 B2 | 11/2007 | Takemura et al. |
| 7,615,786 B2 | 11/2009 | Takemura et al. |
| 2002/0175376 A1 | 11/2002 | Ohtani et al. |
| 2009/0200611 A1 | 8/2009 | Takemura et al. |

FOREIGN PATENT DOCUMENTS

| | | |
|---|---|---|
| JP | 08-037311 A | 2/1996 |
| JP | 2003-017502 A | 1/2003 |

\* cited by examiner

SEMICONDUCTOR DEVICE

BACKGROUND OF THE INVENTION

1. Field of the Invention

The present invention relates to a semiconductor device, a method of manufacturing the same, and electronic device having the same. In particular, the present invention relates to a semiconductor device, which can improve the effect of a hydrogenation treatment in case of using a GOLD (gate-drain overlapped LDD) structure, and a method of manufacturing the same.

2. Description of the Related Art

FIG. 10 is a cross-sectional view explaining a method of manufacturing the conventional semiconductor device. The method of manufacturing the conventional semiconductor device is disclosed in Japanese Patent No. 3,173,135.

As illustrated in FIG. 10, an interlayer insulating film 2-13 is laminated over an entire surface of a substrate on which a sub-gate 2-8 covering a main gate 2-5 is formed. The interlayer insulating film is formed of an oxide film, a nitride film, and the like. Activation annealing is then carried out for the purpose of densifying the interlayer insulating film, activating a source region and drain region, and recovering the crystallinity.

Subsequently, hydrogen ions are introduced by plasma hydrogenation, hydrogen ion implantation, hydrogen diffusion from a plasma nitride film and the like, thereby inactivating dangling bonds in a crystal grain boundary, defects in an interface of a gate oxide film, and defects in a junction of a source or drain portion with a channel portion.

[Patent Document 1]

Japanese Patent No. 3,173,135 (see paragraphs 41 and 42, and FIG. 4)

A hydrogenation treatment has generally been carried out for the purpose of improving transistor characteristics in the step of manufacturing TFTs (thin film transistors). It is important that hydrogen reaches a semiconductor layer in such hydrogenation treatment. Accordingly, it has been important to develop technology for making the hydrogen diffusion easy and for enhancing the effect of the hydrogenation treatment.

SUMMARY OF THE INVENTION

In view of the foregoing, it is an object of the present invention to provide a semiconductor device, which can improve the effect of a hydrogenation treatment, and a method of manufacturing thereof.

In order to overcome the above-mentioned problems, according to one aspect of the invention, a method of manufacturing a semiconductor device according to the present invention, includes the steps of: forming a semiconductor layer having a source region, a drain region and LDD regions, a gate insulating film, and a main gate; forming a sub-gate on the main gate and the gate insulating film so as to cover a part of the main gate and either the LDD regions adjacent to the source region or the drain region; forming an interlayer insulating film containing hydrogen on the sub-gate, the main gate, and the gate insulating film; and performing a heat treatment for hydrogenation such that a crystal defect of the semiconductor layer is hydrogen-terminated.

In accordance with the above-mentioned method of manufacturing the semiconductor device, since the sub-gate is formed so as to cover a part of the main gate and either the LDD regions adjacent to the source region or the drain region, the main gate is exposed from the sub-gate. Therefore, when the interlayer insulating film containing hydrogen is formed and the heat treatment for hydrogenation is then performed, hydrogen contained in the interlayer insulating film easily reaches the semiconductor layer. That is, hydrogen contained in the interlayer insulating film is not necessary to pass through both sub-gate and main gate, and therefore the hydrogen can reach the semiconductor layer only through the main gate. Accordingly, the hydrogen is easily diffused into a channel region of the semiconductor layer, thereby improving the effect of the hydrogenation treatment.

In another aspect of the invention, a method of manufacturing a semiconductor device, includes the steps of: forming a semiconductor layer having a source region, a drain region and LDD regions, a gate insulating film, and a main gate; forming an insulating film on the main gate and the gate insulating film; forming a sub-gate on the insulating film so as to cover a part of the main gate and either the LDD regions adjacent to the source region or the drain region; forming an interlayer insulating film containing hydrogen on the sub-gate and the insulating film; and performing a heat treatment for hydrogenation such that a crystal defect of the semiconductor layer is hydrogen-terminated.

In accordance with the above-mentioned method of manufacturing the semiconductor device, since the sub-gate is formed so as to cover a part of the main gate and either the LDD regions adjacent to the source region or the drain region, the main gate is not entirely covered with the sub-gate. Accordingly, hydrogen is easily diffused into the channel region of the semiconductor layer, thereby improving the effect of the hydrogenation treatment. In addition, the insulating film is formed on the main gate, and therefore it is possible to prevent the main gate from being oxidized in case of thermally activating impurities in the source region, the drain region, and each of the LDD regions.

In another aspect of the invention, a method of manufacturing a semiconductor device, includes the steps of: forming a semiconductor layer having a source region, a drain region and LDD regions, a gate insulating film, and a main gate; forming a sub-gate on the main gate and the gate insulating film so as to cover the main gate and each of the LDD regions, the sub-gate being partly opened on a top surface or a side surface of the main gate; forming an interlayer insulating film containing hydrogen on the sub-gate, the main gate and the gate insulating film; and performing a heat treatment for hydrogenation such that a crystal defect of the semiconductor layer is hydrogen-terminated.

In accordance with the above-mentioned method of manufacturing the semiconductor device, since the sub-gate is partly opened on the top surface or the side surface of the main gate, a part of the top surface or the side surface of the main gate is exposed from the sub-gate. Accordingly, since hydrogen contained in the interlayer insulating film can reaches the semiconductor layer only through the main gate in the opening of the sub-gate, the hydrogen is easily diffused into the channel region of the semiconductor layer, thereby improving the effect of the hydrogenation treatment.

In another aspect of the invention, a method of manufacturing a semiconductor device, includes the steps of: forming a semiconductor layer including a source region, a drain region and LDD regions, a gate insulating film, and a main gate; forming an insulating film on the main gate and the gate insulating film; forming a sub-gate on the insulating film so as to cover the main gate and each of the LDD regions, the sub-gate being partly opened on a top surface or a side surface of the main gate; forming an interlayer insulating film containing hydrogen on the sub-gate and the insulating film; and performing a heat treatment for hydrogenation such that a crystal defect of the semiconductor layer is hydrogen-terminated.

In accordance with the above-mentioned method of manufacturing the semiconductor device, since a part of the sub-gate is opened on the top surface or the side surface of the main gate while covering the main gate and each of the LDD regions, the main gate is not entirely covered with the sub-gate. Accordingly, hydrogen is easily diffused into the channel region of the semiconductor layer, thereby improving the effect of the hydrogenation treatment. Furthermore, by forming the insulating film on the main gate, it is possible to prevent the main gate from being oxidized in case of thermally activating impurities in the source region, the drain region, and each of the LDD regions.

In another aspect of the invention, a method of manufacturing a semiconductor device, includes the steps of: forming a semiconductor layer including a source region, a drain region and LDD regions, a gate insulating film, and a main gate; forming an interlayer insulating film containing hydrogen on the main gate and the gate insulating film; performing a heat treatment for hydrogenation such that a crystal defect of the semiconductor layer is hydrogen-terminated; and forming a sub-gate on the interlayer insulating film so as to cover a part of the main gate and either the LDD regions adjacent to the source region or the drain region.

In accordance with the above-mentioned method of manufacturing the semiconductor device, since the interlayer insulating film containing hydrogen is formed and the heat treatment for hydrogenation is carried out prior to forming the sub-gate, hydrogen contained in the interlayer insulating film easily reaches the semiconductor layer. That is, the hydrogen in the interlayer insulating film is not necessary to pass through both the sub-gate and main gate, and can reach the semiconductor layer only through the main gate. Accordingly, hydrogen is easily diffused into the channel region of the semiconductor layer, thereby improving the effect of the hydrogenation treatment.

In another aspect of the invention, a method of manufacturing a semiconductor device, includes the steps of: forming a semiconductor layer having a source region, a drain region and LDD regions, a gate insulating film, and a main gate; forming an insulating film on the main gate and the gate insulating film; forming an interlayer insulating film containing hydrogen on the insulating film; performing a heat treatment for hydrogenation such that a crystal defect of the semiconductor layer is hydrogen-terminated; and forming a sub-gate on the interlayer insulating film so as to cover a part of the main gate and either the LDD regions adjacent to the source region or the drain region.

In accordance with the above-mentioned method of manufacturing the semiconductor device, since the interlayer insulating film containing hydrogen is formed and the heat treatment is then carried out prior to forming the sub-gate, hydrogen contained in the interlayer insulating film easily reaches the semiconductor layer. That is, the hydrogen contained in the interlayer insulating film is not necessary to pass through both the sub-gate and main gate, and can reach the semiconductor layer only through the main gate. Accordingly, the hydrogen is easily diffused into the channel region, thereby improving the effect of the hydrogenation treatment. In addition, by forming the insulating film on the main gate, it is possible to prevent the main gate from being oxidized in case of thermally activating impurities in the source region, the drain region, and each of the LDD regions.

In another aspect of the invention, a method of manufacturing a semiconductor device, includes the steps of: forming a semiconductor layer having a source region, a drain region and LDD regions, a gate insulating film, and a main gate; forming a first interlayer insulating film containing hydrogen on the main gate and the gate insulating film; forming a sub-gate on the interlayer insulating film so as to cover a part of the main gate and either the LDD regions adjacent to the source region or the drain region; forming a second interlayer insulating film containing hydrogen on the sub-gate; and performing a heat treatment for hydrogenation such that a crystal defect of the semiconductor layer is hydrogen-terminated.

In accordance with the above-mentioned method of manufacturing the semiconductor device, the heat treatment for hydrogenation is carried out after forming the first interlayer insulating film containing hydrogen under the sub-gate and the second interlayer insulating film containing hydrogen on the sub-gate. That is, the two interlayer insulating films for the hydrogenation treatment are layered, and therefore hydrogen contained in the first interlayer insulating film can easily reach the semiconductor film. The hydrogen contained in the first interlayer insulating film is not necessary to pass through both the sub-gate and main gate, and can reach the semiconductor layer only through the main gate. Accordingly, the hydrogen is easily diffused into the channel region of the semiconductor layer, thereby improving the effect of the hydrogenation treatment. Furthermore, the second interlayer insulating film also serves to suppress the formation of hillocks or voids in the sub-gate in the heat treatment for the hydrogenation.

In another aspect of the invention, a method of manufacturing a semiconductor device, includes the steps of: forming a semiconductor layer having a source region, a drain region and LDD regions, a gate insulating film, and a main gate; forming an insulating film on the main gate and the gate insulating film; forming a first interlayer insulating film containing hydrogen on the insulating film; forming a sub-gate on the first interlayer insulating film so as to cover a part of the main gate and either the LDD regions adjacent to the source region or the drain region; forming a second interlayer insulating film containing hydrogen on the sub-gate; and performing a heat treatment for hydrogenation such that a crystal defect of the semiconductor layer is hydrogen-terminated.

In accordance with the above-mentioned method of manufacturing the semiconductor device, since the first interlayer insulating film containing hydrogen is formed under the sub-gate, and the second interlayer insulating film containing hydrogen is formed on the sub-gate prior to performing the heat treatment for hydrogenation, hydrogen can reach the semiconductor layer only through the main gate. Accordingly, hydrogen is easily diffused into the channel region of the semiconductor layer, thereby improving the effect of the hydrogenation treatment. In addition, by forming the insulating film on the main gate, it is possible to prevent the main gate from being oxidized in case of thermally activating impurities in the source region, the drain region, and each of the LDD regions.

According to the method of manufacturing the semiconductor device, after forming the insulating film, the impurities in the source region, the drain region, and each of the LDD regions can be activated by performing the heat treatment to the semiconductor layer.

Further, according to the method of manufacturing the semiconductor device, the sub-gate is preferably formed of Al or Al alloy.

In one aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; a sub-gate formed on the main gate and the gate insulating film so as to cover a part of the main gate and either the LDD regions adjacent to the source region or the drain region; and an interlayer insulating film containing hydrogen formed on the sub-gate, the main-gate, and the gate insulating film.

In another aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; an insulating film formed on the main gate and the gate insulating film; a sub-gate formed on the insulating film so as to cover a part of the main gate and either the LDD regions adjacent to the source region or the drain region; and an interlayer insulating film containing hydrogen formed on the sub-gate and the insulating film.

In another aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; a sub-gate formed on the main gate and the gate insulating film so as to cover the main gate and each of the LDD regions, the sub-gate being partly opened on a top surface or a side surface of the main gate; and an interlayer insulating film containing hydrogen formed on the sub-gate, the main gate, and the gate insulating film.

In another aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; an insulating film formed on the main gate and the gate insulating film; a sub-gate formed on the insulating film so as to cover the main gate and each of the LDD regions, the sub-gate being partly opened on a top surface or a side surface of the main gate; and an interlayer insulating film containing hydrogen formed on the sub-gate and the insulating film.

In another aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; an interlayer insulating film containing hydrogen formed on the main gate and the gate insulating film; and a sub-gate formed on the interlayer insulating film so as to cover a part of the main gate and either the LDD regions adjacent to the source region or the drain region.

In another aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; an insulating film formed on the main gate and the gate insulating film; an interlayer insulating film containing hydrogen formed on the insulating film; and a sub-gate formed on the interlayer insulating film so as to cover a part of the main gate and either the LDD regions adjacent to the source region or the drain region.

In another aspect of the invention, a semiconductor device includes: a source region and a drain region formed in a semiconductor layer; LDD regions formed adjacent to inside of the source region and the drain region in the semiconductor layer; a gate insulating film formed on the semiconductor layer; a main gate formed on the gate insulating film; a first interlayer insulating film containing hydrogen formed on the main gate and the gate insulating film; a sub-gate formed on the first interlayer insulating film so as to cover a part of the main gate and either the LDD regions adjacent to the source region or the drain region; and a second interlayer insulating film containing hydrogen formed on the sub-gate.

In another aspect of the invention, a semiconductor device comprising: a source region and a drain region formed in a semiconductor layer; a plurality of LDD regions formed adjacent to inside of the source region and the drain region in the semiconductor layer; a gate insulating film formed on the semiconductor layer; a main gate formed on the gate insulating film; an insulating film formed on the main gate and the gate insulating film; a first interlayer insulating film containing hydrogen formed on the insulating film; a sub-gate formed on the first interlayer insulating film so as to cover a part of the main gate and either the LDD regions adjacent to the source region or the drain region; and a second interlayer insulating film containing hydrogen formed on the sub-gate.

As set forth above, the invention can provide the semiconductor device, which can improve the effect of the hydrogenation treatment in case of using the GOLD structure, and the method of manufacturing thereof.

DETAILED DESCRIPTION OF THE INVENTION

Preferred embodiment modes of the present invention will be described in more detail below referring to the accompanying drawings.

Embodiment Mode 1

Figure 1:
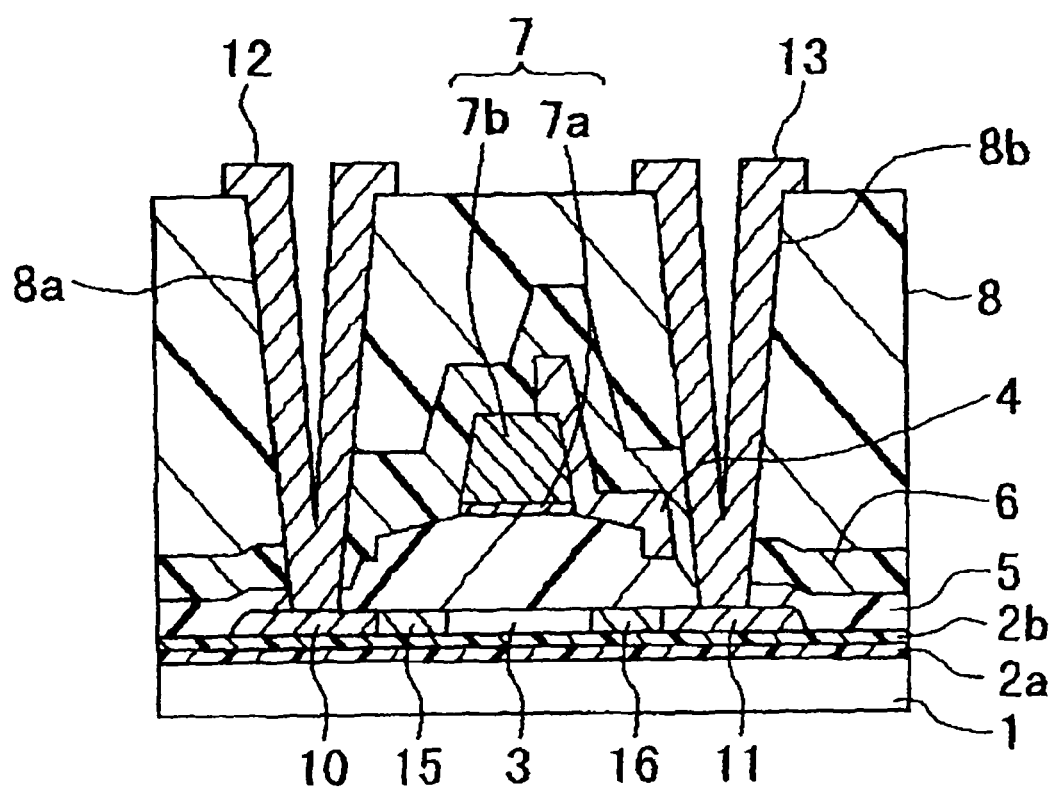
FIG. 1 is a cross-sectional view explaining a method of manufacturing a semiconductor device according to Embodiment Mode 1 of the invention.

FIG. 1 is a cross-sectional view explaining a method of manufacturing a semiconductor device of Embodiment Mode 1 in the invention. The semiconductor device comprises a TFT having the GOLD structure.

At first, a glass substrate 1 is prepared. Base insulating films 2a and 2b comprising an insulating film such as a silicon oxide film, a silicon nitride film, and a silicon oxynitride film are formed on the glass substrate 1. Note that the base insulating films 2a and 2b are formed as barrier films (moving-ion prevention film) so as not to diffuse alkali metal contained in the glass substrate 1 into a semiconductor layer. For example, a SiN film 2a with a thickness of 50 to 100 nm is formed on the substrate and a $SiO_2$ film 2b with a thickness of 50 to 100 nm is formed thereon as a stress relaxation film by CVD or sputtering. Alternatively, a silicon nitride film (SiNO film) containing oxygen may be used as substitute for the SiN film, and a silicon oxide film (SiON film) containing nitrogen or a TEOS (tetraethyl orthosilicate) film may be used as substitute for the $SiO_2$ film. Further, a quartz substrate may be used instead of the glass substrate.

An amorphous silicon film with a thickness of from 40 to 100 nm is formed over the base insulating films 2a and 2b by plasma CVD, reduced pressure CVD, or sputtering.

A solution including a metal element, for example, a nickel acetate solution containing nickel in a concentration of 1 to 100 ppm by weight is applied on the amorphous silicon film by spin coating using a spinner to form a catalytic element containing layer (not illustrated in the drawing). Although the solution containing nickel is used in the embodiment mode, a solution containing the other metal elements can also be used. As the metal elements other than nickel, one or more of elements selected from a group consisting of iron, cobalt, ruthenium, palladium, osmium, iridium, platinum, copper, gold and the like may be used.

Thereafter, the glass substrate 1 is heated, for example, at a temperature of 550° C. for 1 hour to discharge hydrogen contained in the amorphous silicon film. The glass substrate 1 is then heated at 500 to 650° C. for 1 to 24 hours (for example, at 550° C. for 4 hours) to form a crystalline silicon film over the base insulating films 2a and 2b. At this moment, the glass substrate may be heated by being irradiated with laser beam.

Next, in order to improve the crystallinity of the crystalline silicon film, the crystalline silicon film is irradiated with laser beam.

The crystalline silicon film is then coated with a resist film (not illustrated in the drawing). By exposing and developing the resist film, a first resist pattern is formed on the crystalline silicon film. The crystalline silicon film is etched using the first resist pattern as a mask so as to form an island-like semiconductor layer (active layer) 3 comprising the crystalline silicon film over the base insulating films 2a and 2b.

A gate insulating film 5 is formed of a SiON film on the semiconductor layer 3 and the base insulating films 2a and 2b by plasma CVD or sputtering. A first conductive film is then formed of a tantalum nitride film (TaN film) on the gate insulating film 5 by sputtering. A second conductive film is formed of a tungsten film (W film) on the first conductive film by sputtering. Note that, a channel doping may be performed in order to adjust the threshold voltage of a transistor prior to forming the first conductive film.

Subsequently, the second conductive film is coated with a photoresist film (not illustrated in the drawing). By exposing and developing the photoresist film, a second resist pattern is formed on the second conductive film. The first and second conductive films are etched and tapered while receding the second resist pattern.

Only the second conductive film 7b is selectively etched by using the second resist pattern as a mask. Accordingly, the second conductive film is processed so as to expose the first conductive film. The first and second conductive films are formed to have a hat shape, respectively.

A high concentration of impurity, for example, a high concentration of phosphorous is doped into the semiconductor layer 3 while using the first and second conductive films 7a and 7b as masks. Therefore, source and drain regions ($n^+$ regions) 10 and 11 are formed in the semiconductor layer 3. The exposed first conductive film is etched while using the second resist pattern and the second conductive film 7b as masks, and therefore a main gate 7 comprising the first and second conductive films 7a and 7b is formed on the gate insulating film 5. The second resist pattern is then removed.

In order to form LDD regions 15 and 16, a low concentration of impurity, for example, a low concentration of phosphorous is doped into the semiconductor layer 3. Accordingly, the LDD regions ($n^-$ regions) 15 and 16 are formed inside the source and drain regions ($n^+$ regions) 10 and 11 in the semiconductor layer 3.

Next, a third conductive film is formed of a heat resistant material on the main gate 7 and the gate insulating film 5 by sputtering. Next, the third conductive film is coated with a photoresist mask (not illustrated in the drawing). By exposing and developing the photoresist film, a third resist pattern is formed on the third conductive film. The third conductive film is dry etched or wet etched using the third resist pattern as a mask. Accordingly, a sub-gate 4 comprising the third conductive film is formed so as to cover a part of the main gate 7 and either the LDD regions adjacent to the source region or the drain region. The GOLD structure is thus comprising the main gate 7 and the sub-gate 4.

By performing a heat treatment such as furnace annealing, and lump annealing at a temperature of about 550° C., impurities in each of the LDD regions 15 and 16, and source and drain regions 10 and 11 are activated. By performing the heat treatment, Ni contained in a channel region is moved into high concentration impurity regions (source region and the drain region), and therefore gettering can be carried out.

Subsequently, for example, a silicon nitride film (SiN film) is formed on the main gate, the sub-gate 4, and the gate insulating film 5 by plasma CVD to form a first interlayer insulating film 6 containing hydrogen. The first interlayer insulating film 6 containing hydrogen is hydrogenated by heating at 410° C. or more under an $N_2$ atmosphere. Consequently, a crystal defect of the semiconductor layer is hydrogen-terminated. Namely, dangling bonds at an interface of the semiconductor layer 3 or an oxide film, which are caused by dry etching and the like, can be terminated by thermally-excited hydrogen, thereby improving the TFT characteristics.

When the heat treatment for hydrogenation is performed by utilizing hydrogen contained in the silicon nitride film formed by plasma CVD, in order to diffuse hydrogen more easily, the sub-gate 4 is formed so as to cover a part of the main gate 7 and either the LDD regions adjacent to the source region or the drain region, and the main gate 7 is exposed from the main gate. Since the sub-gate has such structure, hydrogen contained in the silicon nitride film easily reaches the semiconductor layer 3 in the case where the silicon nitride film (first interlayer insulating film 6) containing hydrogen is formed and hydrogenated by heating. Hydrogen in the silicon nitride film is not necessary to pass through both the sub-gate and main gate, and can reach the semiconductor layer only through the main gate. Accordingly, hydrogen is easily diffused into the channel region of the semiconductor layer, thereby improving the effect of the hydrogenation treatment.

Next, a second interlayer insulating film 8 having self-flatness such as an organic resin (for example, acrylic) is formed on the interlayer insulating film 6. The second interlayer insulating film 8 is coated with a photoresist film (not illustrated in the drawing). By exposing and developing the photoresist film, a fourth resist pattern is formed on the second interlayer insulating film 8. The first and second interlayer insulating films 6 and 8, and the gate insulating film 5 are etched using the fourth resist pattern as a mask. Therefore, contact holes 8a and 8b positioned on the source and drain regions 10 and 11 are formed in the first and second interlayer insulating films 6 and 8, and the gate insulating film 5. The source region and drain region are partly exposed due to the formation of the contact holes 8a and 8b, respectively. The fourth resist pattern is thus removed.

A fourth conductive film is formed of Al or Al alloy on the second interlayer insulating film 8 and inside the respective contact holes. Next, the fourth conductive film is coated with a photoresist film (not illustrated in the drawing). By exposing and developing the photoresist film, a fifth resist pattern is formed on the fourth conductive film. The fourth conductive film is then etched using the fifth resist pattern as a mask to form wirings 12 and 13 composed of the fourth conductive film on the second interlayer insulating film and inside the contact holes. The wirings 12 and 13 are electrically connected to the source and drain regions 10 and 11, respectively. As a result, a thin film transistor having the GOLD structure can be formed.

According to the above-described Embodiment Mode 1, the sub-gate 4 is formed so as to cover a part of the main gate 7 and either the LDD region adjacent to the source region or the drain region, and hence, the main gate 7 is exposed from the sub-gate 4. Therefore, when the first interlayer insulating film 6 is formed to carry out the heat treatment of hydrogenation, hydrogen contained in the first interlayer insulating film easily reaches the semiconductor layer 3. That is, since hydrogen is not necessary to pass through both the sub-gate and main gate, and can reach the semiconductor layer only through the main gate, the hydrogen is easily diffused into the channel region of the semiconductor layer, thereby improving the effect of the hydrogenation treatment.

Figure 5:
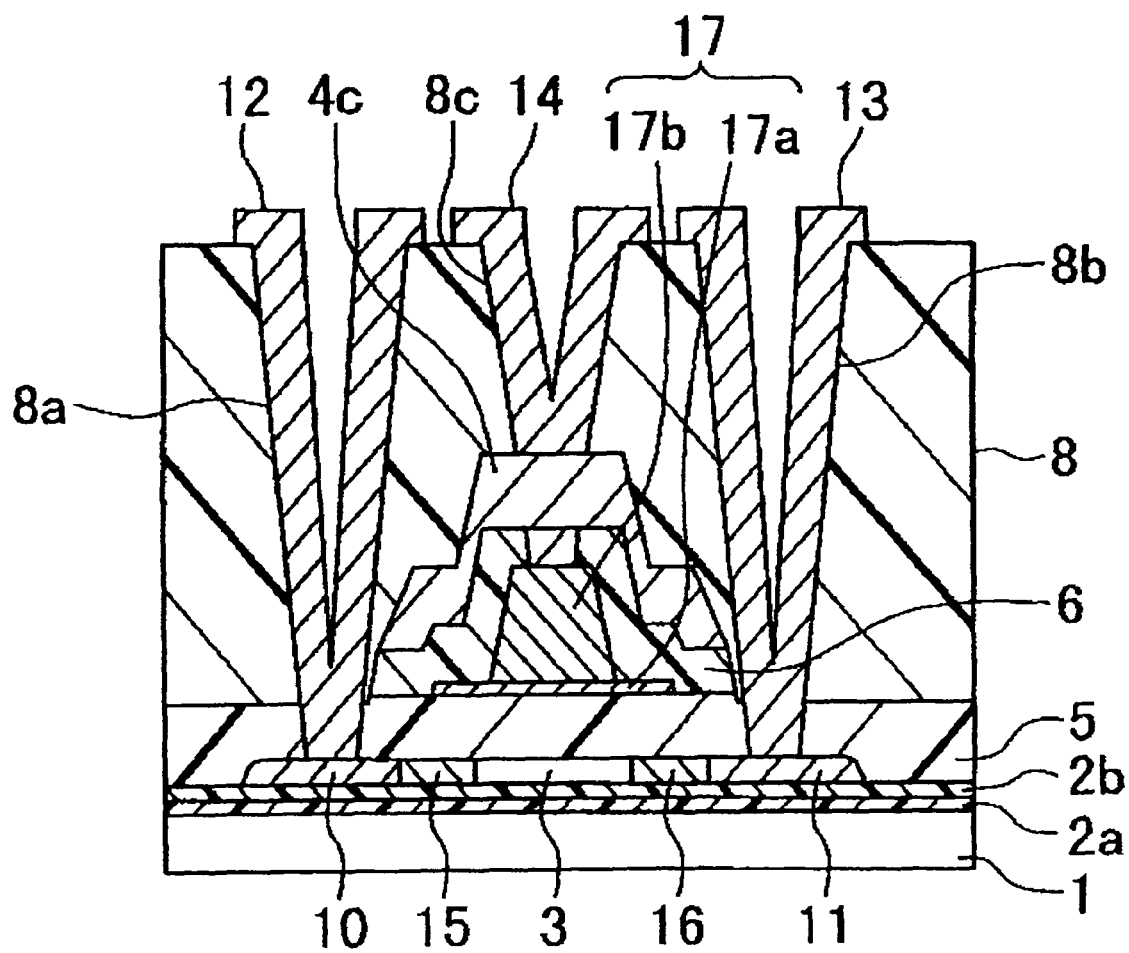
FIG. 5 is a cross-sectional view explaining a method of manufacturing a semiconductor device according to Embodiment Mode 5 of the invention.
Figure 7:
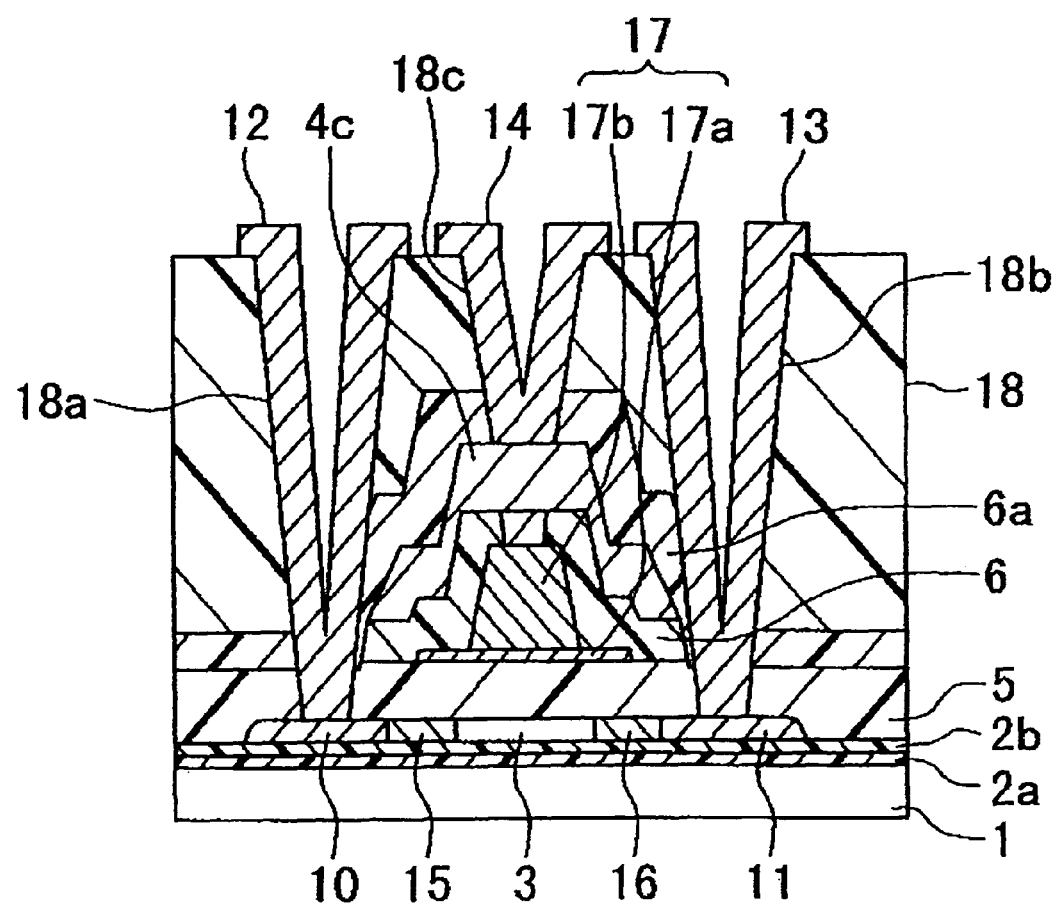
FIG. 7 is a cross-sectional view explaining a method of manufacturing a semiconductor device according to Embodiment Mode 7 of the invention.
Figure 9:
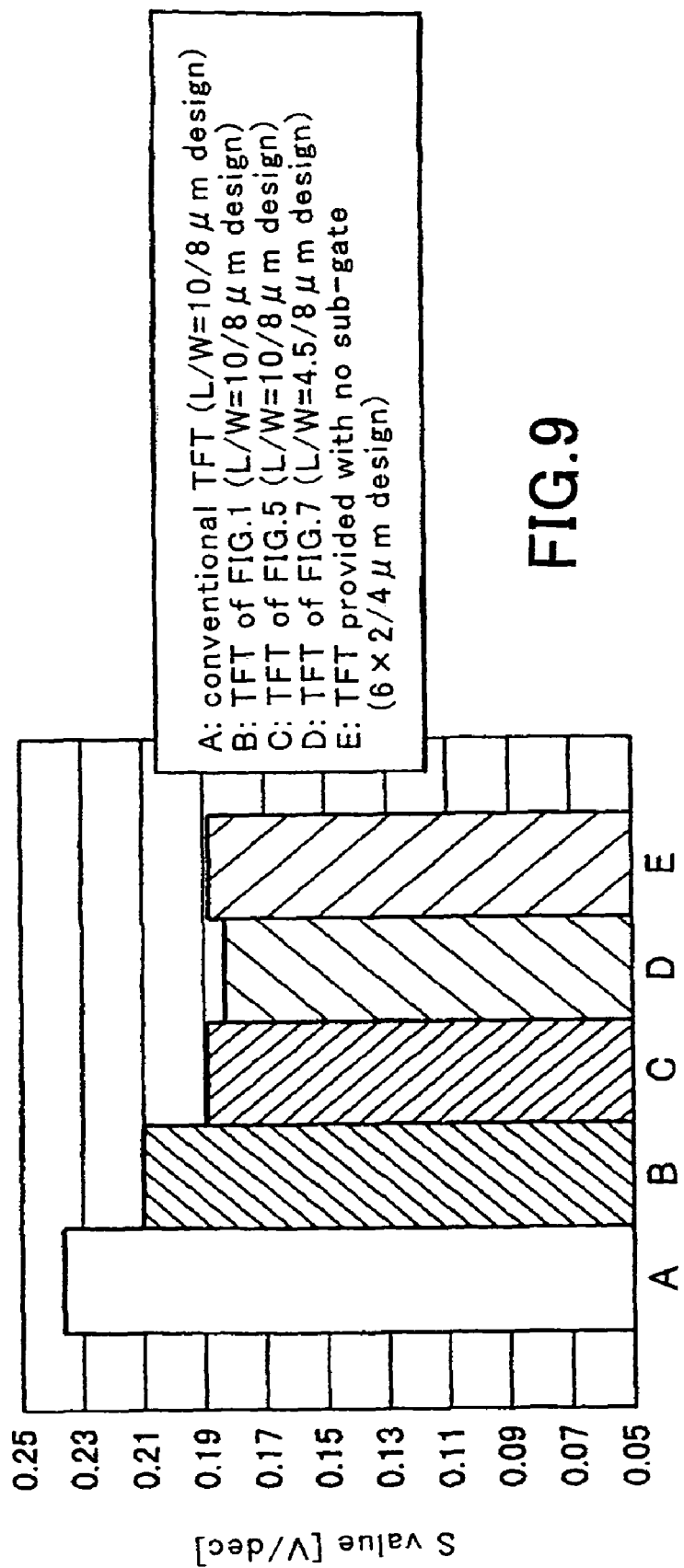
FIG. 9 is a table showing TFT characteristics (subthreshold level of rising characteristics) in the case of manufacturing the conventional TFT A, a TFT B of FIG. 1, a TFT C of FIG. 5, a TFT D of FIG. 7, and a TFT E having no sub-gate.
Figure 10:
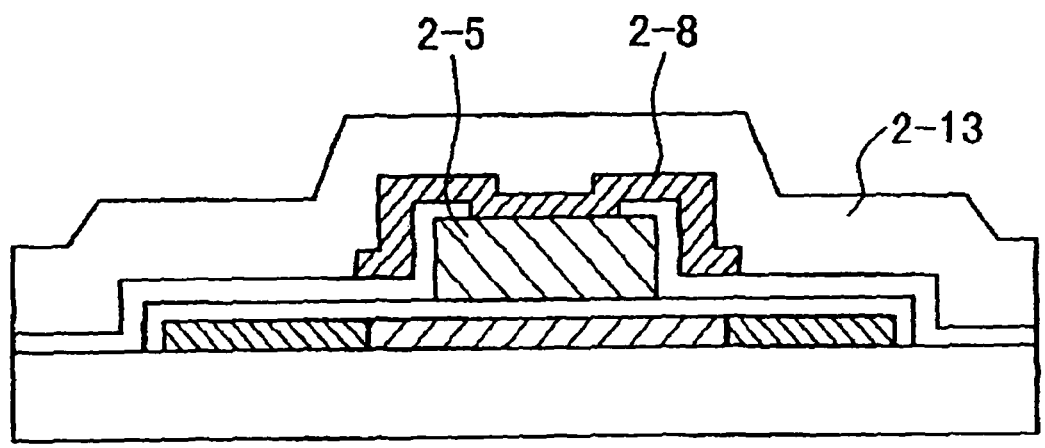
FIG. 10 is a cross-sectional view explaining a method of manufacturing the conventional semiconductor device.

FIG. 9 shows a table showing TFT characteristics (sub-threshold level of rising characteristics) in the case of manufacturing the conventional TFT A, a TFT B of FIG. 1, a TFT C of FIG. 5, a TFT D of FIG. 7, and a TFT E having no sub-gate. As shown in B in FIG. 9, when the rising characteristics (S value) of the TFT B manufactured in the present embodiment mode were measured at 100 points and a middle value of the results was compared with that of the conventional TFT A, it was confirmed that the TFT B had more excellent rising characteristics.

Embodiment Mode 2

Figure 2:
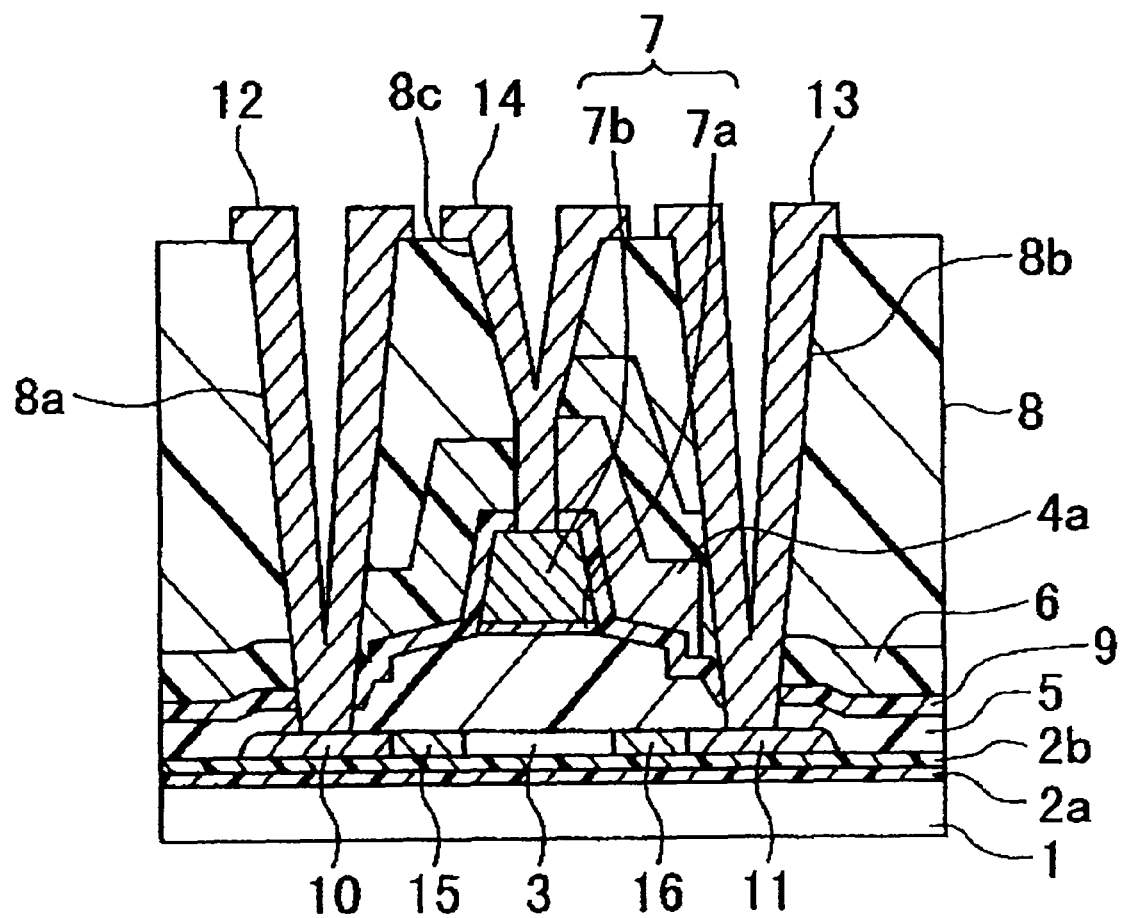
FIG. 2 is a cross-sectional view explaining a method of manufacturing a semiconductor device according to Embodiment Mode 2 of the invention.

FIG. 2 is a cross-sectional view explaining a method of manufacturing a semiconductor device in Embodiment Mode 2 of the present invention. In FIG. 2, portions identical to those in FIG. 1 are denoted by same reference numerals.

The steps for forming the base insulating films 2a and 2b, the semiconductor layer 3, the gate insulating film 5, the main gate 7, the source and drain regions 10 and 11, and the LDD regions 15 and 16 have been already described in Embodiment Mode 1, and will not be further explained.

A silicon oxide ($SiO_2$) film 9 is formed on the main gate 7 and the gate insulating film 5. Subsequently, impurities in the LDD regions 15 and 16, and the source and drain regions 10 and 11 are activated by performing a heat treatment such as furnace annealing and lump annealing at a temperature of about 550° C. In the heat treatment, since the silicon oxide film 9 is formed on the main gate 7, it is possible to prevent the main gate from being oxidized. By carrying out the heat treatment, Ni contained in the channel region is moved into high concentration impurity regions (source and drain regions), and therefore gettering can be performed.

Next, a third conductive film is formed of Al or Al alloy on the silicon oxide film 9 by sputtering and the like. Next, the third conductive film is coated with a photoresist film (not illustrated in the drawing). By exposing and developing the photoresist film, a third resist pattern is formed on the third conductive film. Next, the third conductive film is dry etched or wet etched while using the third resist pattern as a mask. Accordingly, a sub-gate 4a comprising the third conductive film is formed so as to cover a part of the main gate 7 and either the LDD regions adjacent to the source region or the drain region. Thus, the GOLD structure comprising the main gate 7 and the sub-gate 4a is achieved.

For example, a first interlayer insulating film 6 containing hydrogen such as a silicon nitride film (SiN film) is formed on the sub-gate 4a and the silicon oxide film 9 by plasma CVD. A heat treatment for hydrogenation is then performed at a temperature of 410° C. or more under an $N_2$ atmosphere. Consequently, a crystal defect of the semiconductor layer is hydrogen-terminated. That is, dangling bonds at an interface of the semiconductor layer 3 or an oxide film, which are caused by dry etching etc., can be terminated by thermally-excited hydrogen, thereby improving the TFT characteristics.

When the heat treatment for hydrogenation is performed by utilizing hydrogen contained in the silicon nitride film formed by plasma CVD, in order to diffuse hydrogen more easily, the sub-gate 4a is formed so as to cover a part of the main gate 7 and either the LDD regions adjacent to the source region or the drain region such that the main gate 7 is not entirely covered with the sub-gate 4a. Since the sub-gate has such structure, hydrogen contained in the silicon nitride film (first interlayer insulating film) is not necessary to pass through both the sub-gate and main gate, and can reach the semiconductor layer only through the main gate, hydrogen is easily diffused into the channel region of the semiconductor layer, thereby improving the effect of the hydrogenation treatment.

Subsequently, a second interlayer insulating film 8 having self-flatness such as an organic resin (for example, acrylic) is formed on the first interlayer insulating film 6. The second interlayer insulating film 8 is coated with a photoresist film (not illustrated in the drawing). By exposing and developing the photoresist film, a fourth resist pattern is formed on the second interlayer insulating film 8. The first and second interlayer insulating films 6 and 8, the silicon oxide film 9, and the gate insulating film 5 are etched using the fourth resist pattern as a mask. Therefore, contact holes 8a and 8b positioned on the source and drain regions 10 and 11 are formed in the first and second interlayer insulating films 6 and 8, the silicon oxide film 9, and the gate insulating film 5. At the same time, a contact hole 8c is further formed in contact with the sidewall of the sub-gate 4a and on the main gate 7. The source and drain regions are partly exposed due to the formation of the contact holes 8a and 8b whereas the main gate 7 and the sub-gate 4a are partly exposed due to the formation of the contact hole 8c. The fourth resist pattern is thus removed.

A fourth conductive film is formed of Al or Al alloy on the second interlayer insulating film 8 and inside the contact holes. The fourth conductive film is coated with a photoresist film (not illustrated in the drawing). By exposing and developing the photoresist film, a fifth resist pattern is formed on the fourth conductive film. The fourth conductive film is then etched using the fifth resist pattern as a mask so as to form wirings 12 to 14 composed of the fourth conductive film on the second interlayer insulating film and inside the respective contact holes. The wirings 12 and 13 are electrically connected to the source and drain regions 10 and 11, respectively. The wiring 14 has a function of electrically connecting the main gate 7 to the sub-gate 4a. As a result, a thin film transistor having the GOLD structure can be formed.

In Embodiment Mode 2 described above, same advantageous effect as Embodiment Mode 1 can be obtained. Namely, the sub-gate 4a composed of the third conductive film is formed so as to cover a part of the main gate 7 and either the LDD regions adjacent to the source region or the drain region, and hence, the main gate 7 is not entirely covered with the sub-gate 4. Therefore, since hydrogen contained in the first interlayer insulating film is not necessary to pass through both the sub-gate and main gate, and can reach to the semiconductor layer only through the main gate, the hydrogen is easily diffused into the channel region of the semiconductor layer, thereby improving the effect of the hydrogenation treatment.

Embodiment Mode 3

Figure 3:
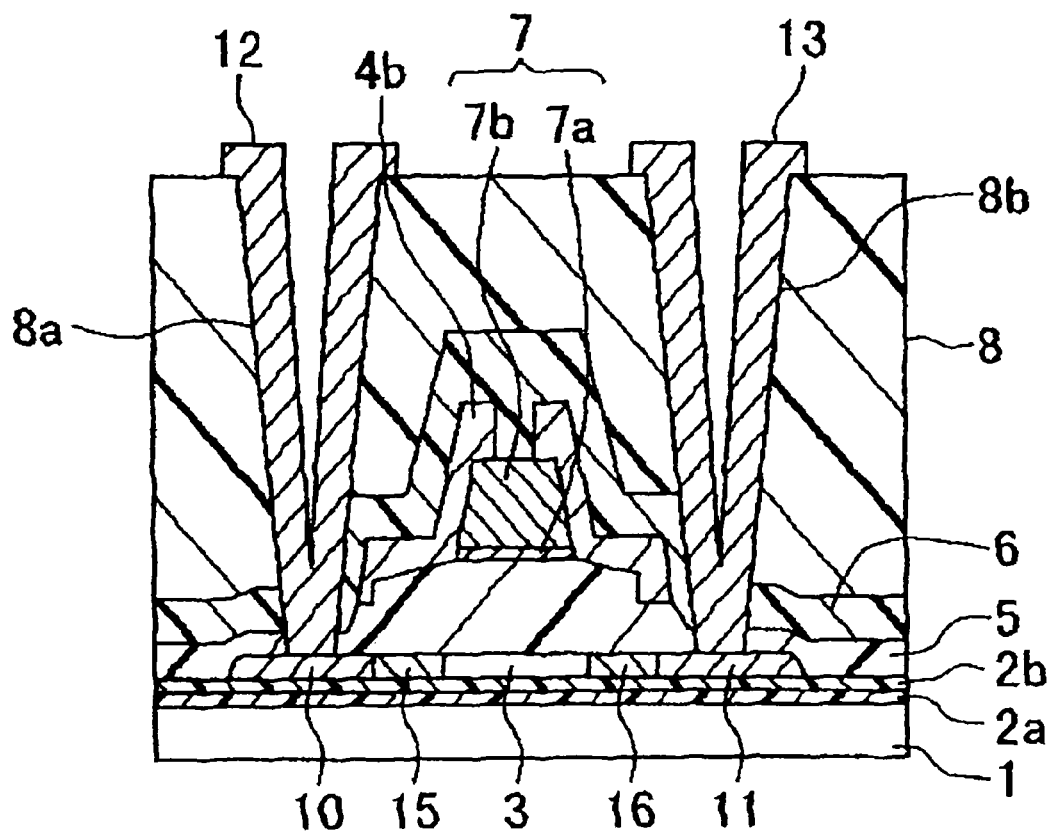
FIG. 3 is a cross-sectional view explaining a method of manufacturing a semiconductor device according to Embodiment Mode 3 of the invention.

FIG. 3 is a cross-sectional view explaining a method of manufacturing a semiconductor device according to Embodiment Mode 3 of the invention. In FIG. 3, portions identical to those in FIG. 1 are denoted by same reference numerals.

The steps for forming the base insulating films 2a and 2b, the semiconductor layer 3, the gate insulating film 5, the main gate 7, the source and drain regions 10 and 11, and the LDD regions 15 and 16 have been already described in Embodiment Mode 1, and will not be further explained.

Next, a third conductive film is formed of a heat resistant material on the main gate 7 and the gate insulating film 5 by sputtering. Next, the third conductive film is coated with a photoresist film (not illustrated in the drawing). By exposing and developing the photoresist film, a third resist pattern is formed on the third conductive film. The third resist pattern is dry etched or wet etched while using the third resist pattern as a mask. Accordingly, a sub-gate 4b composed of the third conductive film is formed so as to cover the main gate 7 and each of the LDD regions. The sub-gate 4b is partly opened on a top surface of the main gate 7. The GOLD structure comprises the main gate 7 and the sub-gate 4b. The subsequent steps are identical to Embodiment Mode 1, and will not be further explained.

According to the above-described Embodiment Mode 3, same advantageous effect as Embodiment Mode 1 can be obtained. That is, when the heat treatment for hydrogenation is carried out by utilizing hydrogen contained in the silicon nitride film formed by plasma CVD, in order to diffuse the hydrogen more easily, the sub-gate 4b formed on the main gate 7 is partly opened on the top surface of the main gate so as to expose the top surface of the main gate. By using the sub-gate having such structure, in the case where the silicon nitride film containing hydrogen (first interlayer insulating film 6) is formed to perform the heat treatment for hydrogenation, hydrogen contained in the silicon nitride film is not necessary to pass through both the sub-gate and main gate, and can reach the semiconductor layer only through the main gate at the opening of the sub-gate. The hydrogen is easily diffused into the channel region of the semiconductor layer, thereby improving the effect of the hydrogenation treatment.

Note that the sub-gate 4b, which is partly opened on the top surface of the main gate, is employed in Embodiment Mode 3. However, the opening portion is not limited to the top surface of the main gate, and another sub-gate, which is partly opened on a side surface of the main gate, can also be used.

Embodiment Mode 4

Figure 4:
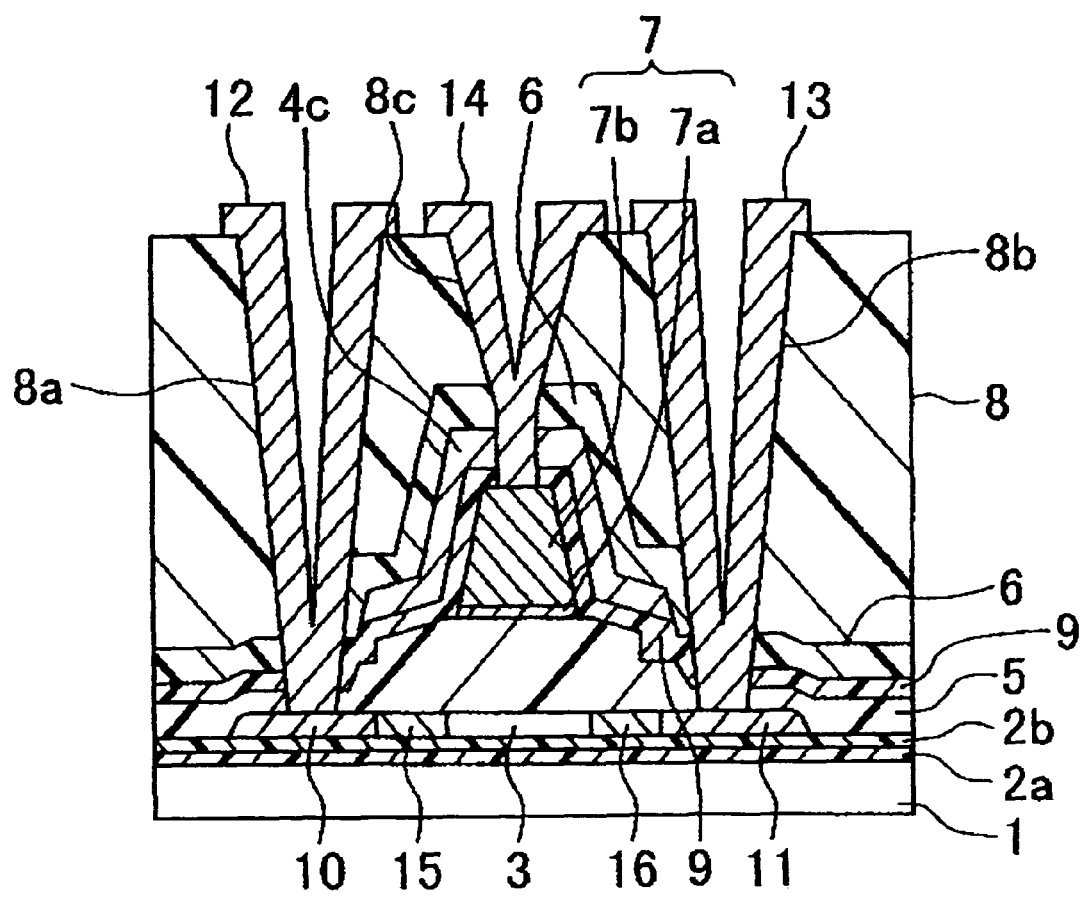
FIG. 4 is a cross-sectional view explaining a method of manufacturing a semiconductor device according to Embodiment Mode 4 of the invention.

FIG. 4 is a cross-sectional view explaining a method of manufacturing a semiconductor device in Embodiment Mode 4 of the invention. In FIG. 4, portions identical to those in FIG. 2 are denoted by same reference numerals.

The steps for forming the base insulating films 2a and 2b, the semiconductor layer 3, the gate insulating film 5, the main gate 7, the source and drain regions 10 and 11, the LDD regions 15 and 16, and the silicon oxide film 9 have been already described in Embodiment Mode 2, and will not be further explained.

Next, a third conductive film is formed of Al or Al alloy on the silicon oxide film 9 by sputtering and the like. Next, the third conductive film is coated with a photoresist film (not illustrated in the drawing). By exposing and developing the photoresist film, a third resist pattern is formed on the third conductive film. The third conductive film is dry etched or wet etched while using the third resist pattern as a mask. Accordingly, a sub-gate 4c composed of the third conductive film is formed so as to cover the main gate 7 and each of the LDD regions. The sub-gate 4c is partly opened on a top surface of the main gate 7. Thus, the GOLD structure comprising the main gate 7 and the sub-gate 4c is achieved. The subsequent steps are identical to those in Embodiment Mode 2, and will not be further explained.

According to the above-described Embodiment Mode 4, same advantageous effect as Embodiment Mode 2 can be obtained. That is, when the heat treatment for hydrogenation is carried out by utilizing hydrogen contained in the silicon nitride film formed by plasma CVD, in order to diffuse the hydrogen more easily, the sub-gate 4c for covering the main gate 7 and each of the LDD regions is partly opened on a top surface of the main gate so as not to cover the main gate entirely. By using the sub-gate having such a structure, in the case where the silicon nitride film containing hydrogen (first interlayer insulating film 6) is formed to perform the heat treatment for hydrogenation, hydrogen contained in the silicon nitride film is not necessary to pass through both the sub-gate and main gate, and can reach the semiconductor layer only through the main gate at the opening of the sub-gate. The hydrogen is easily diffused into the channel region of the semiconductor layer, thereby improving the effect of the hydrogenation treatment.

The sub-gate 4c, which is partly opened on the top surface of the main gate, is employed in Embodiment Mode 4. However, the opening portion is not limited to the top surface of the main gate, and another sub-gate, which is partly opened on a side surface of the main gate, can also be used.

Embodiment Mode 5

FIG. 5 is a cross-sectional view explaining a method of manufacturing a semiconductor device in Embodiment Mode 5 of the present invention. In FIG. 5, portions identical to those in FIG. 1 are denoted by same reference numerals.

The steps for forming the base insulating films 2a and 2b, the semiconductor layer 3, and the gate insulating film 5 have been already described in Embodiment Mode 1, and will not be further explained.

A first conductive film is formed of a tantalum nitride film (TaN film) on the gate insulating film 5 by sputtering. A second conductive film is formed of a tungsten film (W film) on the first conductive film by sputtering. A channel doping may be performed in order to adjust the threshold voltage of a transistor prior to forming the first conductive film.

Subsequently, the second conductive film is coated with a photoresist film (not illustrated in the drawing). By exposing and developing the photoresist film, a second resist pattern is formed on the second conductive film. Next, the first and second conductive films are etched and tapered while receding the second resist pattern.

Next, only a second conductive film 17b is selectively etched while using the second resist pattern as a mask. Accordingly, the second conductive film is processed so as to expose the first conductive film. As a result, a main gate 17 composed of the first and second conductive films 17a and 17b is formed on the gate insulating film 5. The main gate 17 has a hat shape.

A high concentration of impurity, for example, a high concentration of phosphorous is doped into the semiconductor layer 3 while using the main gate 17 as a mask. Therefore, the source and drain regions ($n^+$ regions) 10 and 11 are formed in the semiconductor layer 3.

In order to form the LDD regions 15 and 16, a low concentration of impurity, for example, a low concentration of phosphorous is doped into the semiconductor layer 3. Accordingly, the LDD regions ($n^-$ regions) 15 and 16 are formed inside the source and drain regions ($n^+$ regions) 10 and 11 in the semiconductor layer 3.

By performing a heat treatment such as furnace annealing, and lump annealing at a temperature of about 550° C., impurities in each of the LDD regions 15 and 16, and source and drain regions 10 and 11 are activated. Note that, by performing the heat treatment, Ni contained in a channel region is moved into high concentration impurity regions (source and drain regions), and therefore gettering can be carried out.

Subsequently, for example, a silicon nitride film (SiN film) is formed on the main gate 17 and the gate insulating film 5 by plasma CVD to form a first interlayer insulating film 6 containing hydrogen. The first interlayer insulating film 6 is then hydrogenated by heating at 410° C. or more under an $N_2$ atmosphere. A crystal defect of the semiconductor layer is thus hydrogen-terminated. Namely, dangling bonds at an interface of the semiconductor layer 3 or an oxide film, which are caused by dry etching etc., can be terminated by thermally-excited hydrogen, thereby improving the TFT characteristics.

When the heat treatment for hydrogenation is performed by utilizing hydrogen contained in the silicon nitride film formed by plasma CVD, in order to diffuse the hydrogen more easily, the silicon nitride film containing hydrogen (first interlayer insulating film 6) is formed and hydrogenated by heating prior to forming the sub-gate 4c. Accordingly, hydrogen contained in the first interlayer insulating film easily reaches the semiconductor layer 3. The hydrogen in the first interlayer insulating film is not necessary to pass through both the sub-gate and main gate, and can reach the semiconductor layer only through the main gate. Accordingly, the hydrogen is easily diffused into the channel region of the semiconductor layer, thereby improving the effect of the hydrogenation treatment.

Next, a third conductive film is formed of Al or Al alloy on the first interlayer insulating film 6 by sputtering and the like. Next, the third conductive film is coated with a photoresist film (not illustrated in the drawing). By exposing and developing the photoresist film, a third resist pattern is formed on the third conductive film. The third conductive film is dry etched or wet etched while using the third resist pattern as a mask. Accordingly, a sub-gate 4c comprising the third conductive film is formed so as to cover a part of the main gate 17, the LDD regions, the source region, and the drain region. The GOLD structure comprising the main gate 17 and the sub-gate 4c is thus achieved. Next, the interlayer insulating film 6 is then etched using the sub-gate 4c as a mask.

Next, a second interlayer insulating film 8 having self-flatness such as an organic resin (for example, acrylic) is formed on the interlayer insulating film 6. Next, the second interlayer insulating film 8 is coated with a photoresist film (not illustrated in the drawing). By exposing and developing the photoresist film, a resist pattern is formed on the second interlayer insulating film 8. The second interlayer insulating film 8, the gate insulating film 5, the sub-gate 4c, and the first interlayer insulating film 6 are etched while using the resist pattern as a mask. Therefore, contact holes 8a and 8b positioned on the source and drain regions 10 and 11 are formed in the first and second interlayer insulating films 6 and 8, and the gate insulating film 5. A contact hole 8c positioned on the main gate 17 is formed in the first and second interlayer insulating films 6 and 8, and the sub-gate 4c. The source and drain regions are partly exposed due to the formation of the contact holes 8a and 8b, while the main gate 17 is partly exposed due to the formation of the contact hole 8c. The resist pattern is then removed.

A fourth conductive film is formed of Al or Al alloy on the second interlayer insulating film 8 and inside the respective contact holes. Next, the fourth conductive film is coated with a photoresist film (not illustrated in the drawing). By exposing and developing the photoresist film, a resist pattern is formed on the fourth conductive film. The fourth conductive film is then etched using the resist pattern as a mask so as to form wirings 12 to 14 comprising the fourth conductive film on the second interlayer insulating film and inside the contact holes. The wirings 12 and 13 are electrically connected to the source and drain regions 10 and 11, respectively. The wiring 14 is electrically connected to the main gate 17 and the sub-gate 4c. As a result, a thin film transistor having the GOLD structure is formed.

According to the above-described Embodiment Mode 5, since the first interlayer insulating film 6 containing hydrogen is formed and hydrogenated by heating prior to forming the sub-gate 4c, hydrogen contained in the first interlayer insulating film easily reaches the semiconductor layer 3. That is, the hydrogen in the interlayer insulating film is not necessary to pass through both the sub-gate and main gate, and can reach the semiconductor layer only through the main gate. Accordingly, the hydrogen is easily diffused into the channel region of the semiconductor layer, thereby improving the effect of the hydrogenation treatment.

As shown in C in FIG. 9, when the rising characteristics of the TFT C manufactured in the present embodiment mode were measured at 100 points and a middle value of the results was compared with that of the conventional TFT A, it was confirmed that the TFT of the present embodiment mode had superior rising characteristics that were equivalent to those of a TFT provided with no sub-gate.

The sub-gate 4c is formed so as to cover a part of the main gate 17, the LDD regions, the source region, and the drain region in Embodiment Mode 5. Alternatively, the sub-gate can be formed so as to cover at least a part of the main gate and either the LDD regions adjacent to the source region or the drain region.

Embodiment Mode 6

Figure 6:
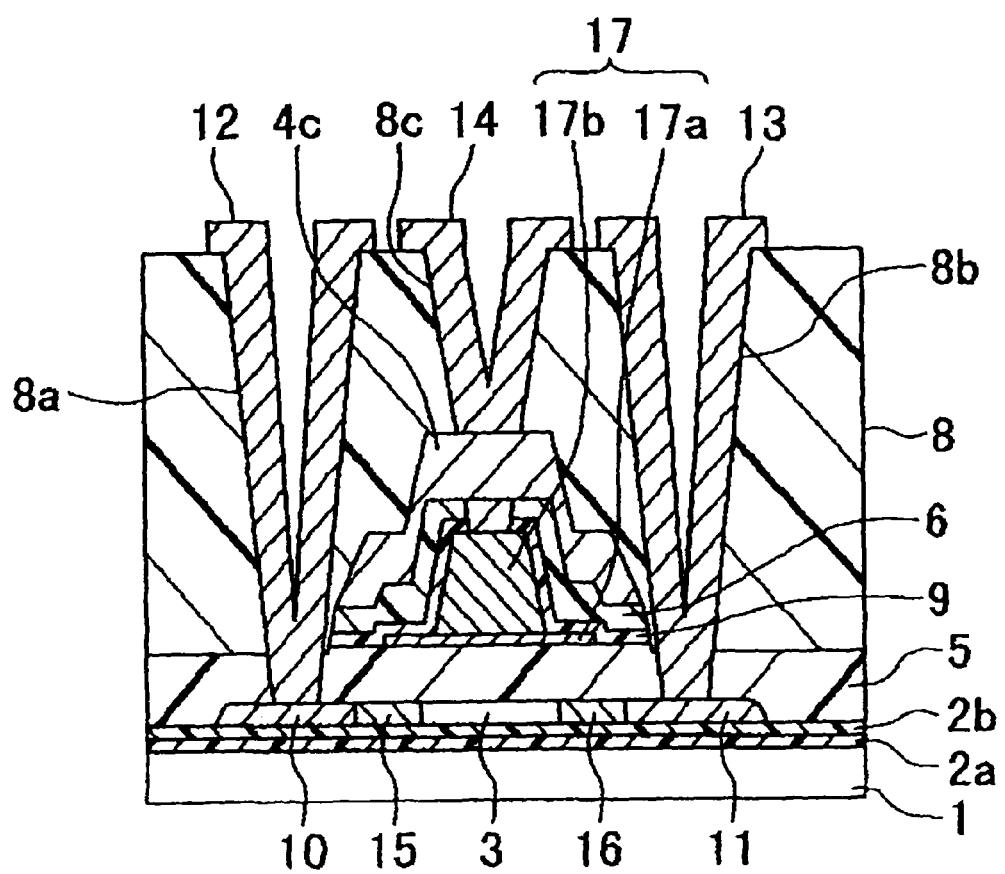
FIG. 6 is a cross-sectional view explaining a method of manufacturing a semiconductor device according to Embodiment Mode 6 of the invention.

FIG. 6 is a cross-sectional view explaining a method of manufacturing a semiconductor device in Embodiment Mode 6 of the invention. In FIG. 6, portions identical to those in FIG. 5 are denoted by same reference numerals.

The steps for forming the base insulating films 2a and 2b, the semiconductor layer 3, the gate insulating film 5, the main gate 17, the source and drain regions 10 and 11, and the LDD regions 15 and 16 have been already described in Embodiment Mode 5, and will not be further explained.

Next, a silicon oxide ($SiO_2$) film 9 is formed on the main gate 17 and the gate insulating film 5. Subsequently, impurities in the LDD regions 15 and 16, and the source and drain region 10 and 11 are activated by performing a heat treatment such as furnace annealing and lump annealing at a temperature of about 550° C. In the heat treatment, since the silicon oxide film 9 is formed on the main gate 7, it is possible to prevent the main gate from being oxidized. By carrying out the heat treatment, Ni contained in the channel region is moved into high concentration impurity regions (source and drain regions), and therefore gettering can be performed.

Subsequently, for instance, a silicon nitride film (SiN film) is formed on the silicon oxide film 9 by plasma CVD to form a first interlayer insulating film 6 containing hydrogen. Then, the silicon nitride film is hydrogenated by heating at 410° C. or more under an $N_2$ atmosphere. A crystal defect of the semiconductor layer is thus hydrogen-terminated. Namely, dangling bonds at an interface of the semiconductor layer 3 or an oxide film, which are caused by dry etching etc., can be terminated by thermally-excited hydrogen, thereby improving the TFT characteristics.

When the heat treatment for hydrogenation is performed by utilizing hydrogen contained in the silicon nitride film formed by plasma CVD, in order to diffuse hydrogen easily, the silicon nitride film containing hydrogen (first interlayer insulating film 6) is formed and hydrogenated by heating prior to forming the sub-gate 4c. Accordingly, hydrogen contained in the first interlayer insulating film easily reaches the semiconductor layer 3. The hydrogen in the first interlayer insulating film is not necessary to pass through both the sub-gate and main gate, and can reach the semiconductor layer only through the main gate. Accordingly, the hydrogen is easily diffused into the channel region of the semiconductor layer, thereby improving the effect of the hydrogenation treatment.

Next, a third conductive film is formed of Al or Al alloy on the first interlayer insulating film 6 by sputtering and the like. The third conductive film is coated with a photoresist film (not illustrated in the drawing). By exposing and developing the photoresist film, a third resist pattern is formed on the third conductive film. Next, the third conductive film is dry etched or wet etched while using the third resist pattern as a mask. Accordingly, a sub-gate 4c comprising the third conductive film is formed so as to cover a part of the main gate 17, the LDD regions, the source region, and the drain region. The GOLD structure comprising the main gate 17 and the sub-gate 4a is thus achieved. The first interlayer insulating film 6 and the silicon oxide film 9 are etched using the sub-gate 4c as a mask.

Next, a second interlayer insulating film 8 having self-flatness such as an organic resin (for example, acrylic) is formed on the first interlayer insulating film 6. The subsequent steps are same as those in Embodiment Mode 5, and will not be further explained.

According to the above-described Embodiment Mode 6, the same advantageous effect as Embodiment Mode 5 can be obtained. That is, the first interlayer insulating film 6 containing hydrogen is formed and heated for hydrogenation prior to forming the sub-gate 4c, and therefore hydrogen contained in the first interlayer insulating film easily reaches the semiconductor layer 3. Since hydrogen in the first interlayer insulating film is not necessary to pass through both the sub-gate and main gate, and can reach the semiconductor layer only through the main gate, the hydrogen is easily diffused into the channel region of the semiconductor layer. As a result, the effect of the hydrogenation treatment can be improved.

When the rising characteristics of the TFT manufactured according to the present embodiment mode were measured at 100 points and a middle value of the results was compared with that of the conventional TFT, it was confirmed that the TFT of the present embodiment mode had superior rising characteristics that were equivalent to those of a TFT provided with no sub-gate.

Embodiment Mode 7

FIG. 7 is a cross-sectional view explaining a method of manufacturing a semiconductor device in Embodiment Mode 7 of the invention. In FIG. 7, portions identical to those in FIG. 5 are denoted by same reference numerals.

The steps for forming the base insulating films 2a and 2b, the semiconductor layer 3, the gate insulating film 5, the main gate 17, the source and drain regions 10 and 11, and the LDD regions 15 and 16 have been already described in Embodiment Mode 5, and will not be further explained.

For example, a silicon nitride film (SiN film) is formed on the main gate 17 and the gate insulating film 5 by plasma CVD to form a first interlayer insulating film 6 containing hydrogen.

A third conductive film is formed of Al or Al alloy on the first interlayer insulating film 6 by sputtering and the like. The third conductive film is coated with a photoresist film (not illustrated in the drawing). By exposing and developing the photoresist film, a third resist pattern is formed on the third conductive film. Next, the third conductive film is dry etched or wet etched while using the third resist pattern as a mask. Accordingly, a sub-gate 4c comprising the third conductive film is formed so as to cover a part of the main gate 17, the LDD regions, the source region, and the drain region. The GOLD structure comprising the main gate 17 and the sub-gate 4c is thus achieved. The first interlayer insulating film 6 is thus etched while using the sub-gate 4c as a mask.

Subsequently, a silicon nitride film (SiN film) is formed on the sub-gate 4c and the gate insulating film 5 by plasma CVD to form a second interlayer insulating film 6a containing hydrogen. The second interlayer insulating film 6a is hydrogenated by heating at 410° C. or more under an $N_2$ atmosphere. Accordingly, a crystal defect of the semiconductor layer is hydrogen-terminated. Namely, dangling bonds at an interface of the semiconductor layer 3 or an oxide film, which are caused by dry etching etc., can be terminated by thermally-excited hydrogen, thereby improving the TFT characteristics.

When the heat treatment for hydrogenation is performed by utilizing hydrogen contained in the silicon nitride film formed by plasma CVD, in order to diffuse hydrogen more easily, the silicon nitride film containing hydrogen (first interlayer insulating film 6) is formed under the sub-gate 4c, and another silicon nitride film containing hydrogen (second interlayer insulating film 6a) is formed over the sub-gate 4c prior to performing the heat treatment for hydrogenation. Since the two interlayer insulating films for the hydrogenation treatment are laminated in this manner, hydrogen contained in the first interlayer insulating film can easily reach the semiconductor layer 3. The hydrogen in the first interlayer insulating film is not necessary to pass through both the sub-gate and main gate, and can reach the semiconductor layer only through the main gate. Accordingly, hydrogen is easily diffused into the channel region of the semiconductor layer, thereby improving the effect of the hydrogenation treatment.

Furthermore, the second interlayer insulating film 6a also has a function of suppressing the formation of hillocks or voids in the sub-gate 4c in the heat treatment for hydrogenation.

Next, a third interlayer insulating film 18 having self-flatness such as an organic resin (for example, acrylic) is formed on the second interlayer insulating film 6a. Next, the third interlayer insulating film 18 is coated with a photoresist film (not illustrated in the drawing). By exposing and developing the photoresist film, a resist pattern is formed on the third interlayer insulating film 18. The third interlayer insulating film 18, the second interlayer insulating films 6a, the gate insulating film 5, the sub-gate 4c, and the first interlayer insulating film 6 are etched while using the resist pattern as a mask. Therefore, contact holes 18a and 18b positioned on the source and drain regions 10 and 11 are formed in the second and third interlayer insulating films 6a and 18 and the gate insulating film. At the same time, a contact hole 18c positioned on the main gate 17 is formed in the first to third interlayer insulating films 6, 6a and 18, and the sub-gate 4c. The source and drain regions are partly exposed due to the formation of the contact holes 18a and 18b whereas the main gate 17 is partly exposed due to the formation of the contact hole 18c. The resist pattern is then removed.

Thereafter, a fourth conductive film is formed of Al or Al alloy on the third interlayer insulating film 18 and inside the respective contact holes. Next, the fourth conductive film is coated with a photoresist film (not illustrated in the drawing). By exposing and developing the photoresist film, a resist pattern is formed on the fourth conductive film. Next, the fourth conductive film is then etched using the resist pattern as a mask so as to form wirings 12 to 14 comprising of the fourth conductive film on the third interlayer insulating film and inside the contact holes. The wirings 12 and 13 are electrically connected to the source and drain regions 10 and 11, respectively. The wiring 14 has a function of electrically connecting the main gate 17 to the sub-gate 4a. As a result, a thin film transistor having the GOLD structure can be formed.

According the above-described Embodiment Mode 7, the hydrogenation treatment is performed after forming the first interlayer insulating film 6 containing hydrogen under the sub-gate 4c and forming the second interlayer insulating film 6a containing hydrogen on the sub-gate 4c. That is, the two interlayer insulating films for the hydrogenation treatment are layered, and hence, hydrogen contained in the first interlayer insulating film easily reaches the semiconductor layer 3. Since the hydrogen in the interlayer insulating film is not necessary to pass through both the main gate and sub-gate, and can reach the semiconductor layer only through the main gate, the hydrogen is easily diffused into the channel region of the semiconductor layer, thereby improving the effect of the hydrogenation treatment.

As shown in D in FIG. 9, when the rising characteristics (S value) of the TFT D manufactured according to the present embodiment mode were measured at 100 points and a middle value of the results was compared with that of the conventional TFT A, it was confirmed that the TFT of the present embodiment mode had superior rising characteristics that were equivalent to those of a TFT provided with no sub-gate.

Embodiment Mode 8

Figure 8:
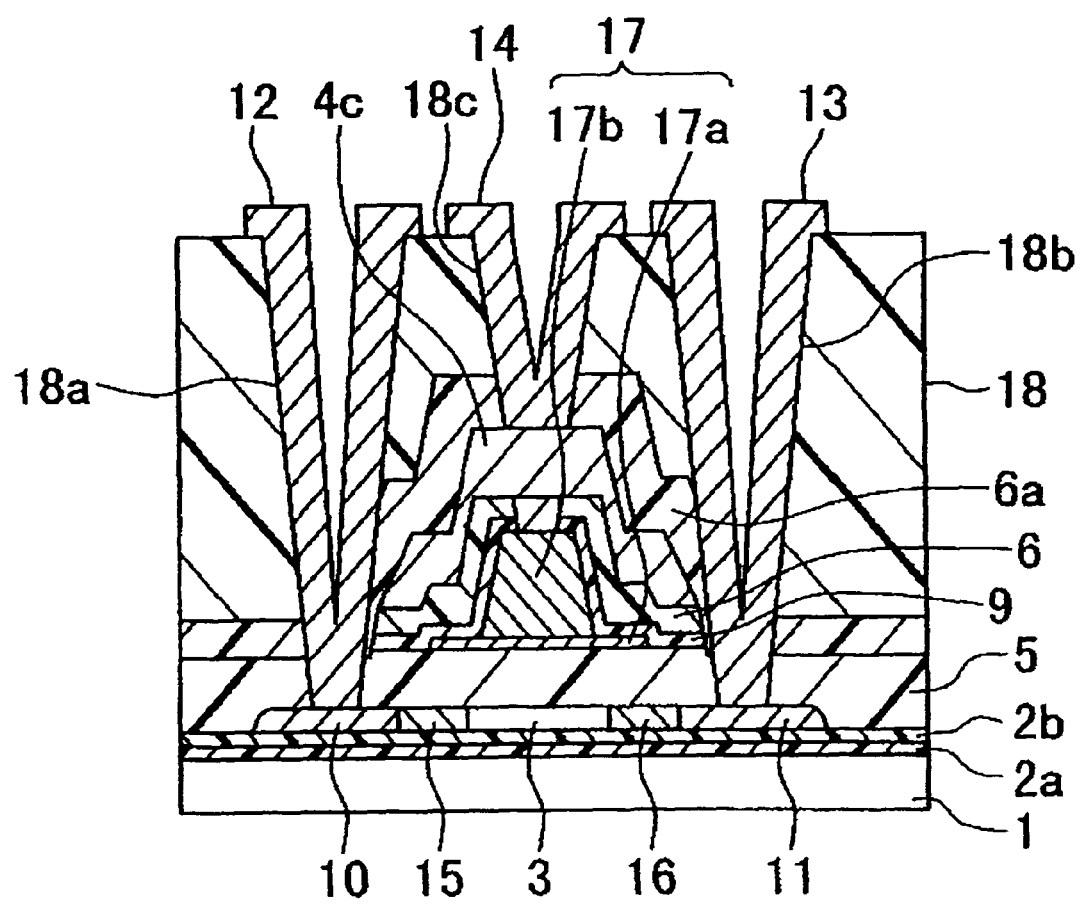
FIG. 8 is a cross-sectional view explaining a method of manufacturing a semiconductor device according to Embodiment Mode 8 of the invention.

FIG. 8 is a cross-sectional view explaining a method of manufacturing a semiconductor device in Embodiment Mode 8 of the invention. In FIG. 8, portions identical to those in FIG. 7 are denoted by same reference numerals.

The steps for forming the base insulating films 2a and 2b, the semiconductor layer 3, the gate insulating film 5, the main gate 17, the source and drain regions 10 and 11, and the LDD regions 15 and 16 have been already described in Embodiment Mode 7, and will not be further explained.

A silicon oxide ($SiO_2$) film 9 is formed on the main gate 17 and the gate insulating film 5. Subsequently, impurities in each of the LDD regions 15 and 16, and the source and drain regions 10 and 11 are activated by performing a heat treatment such as furnace annealing and lump annealing at a temperature of about 550° C. In the heat treatment, since the silicon oxide film 9 is formed on the main gate 17, it is possible to prevent the main gate from being oxidized. By carrying out the heat treatment, Ni contained in a channel region is moved into high concentration impurity regions (source and drain regions), and therefore gettering can be performed.

For example, a silicon nitride film (SiN film) is formed on the silicon oxide film 9 by plasma CVD to form a first interlayer insulating film 6 containing hydrogen.

Subsequently, a third conductive film is formed of Al or Al alloy on the first interlayer insulating film 6 by sputtering and the like. The third conductive film is coated with a photoresist film (not illustrated in the drawing). By exposing and developing the photoresist film, a third resist pattern is formed on the third conductive film. The third conductive film is dry etched or wet etched while using the third resist pattern as a mask. Accordingly, a sub-gate 4c composed of the third conductive film is formed so as to cover a part of the main gate 17, the LDD regions, the source region, and the drain region. The GOLD structure composed of the main gate 17 and the sub-gate 4c is thus achieved. Next, the first interlayer insulating film 6 and the silicon oxide film 9 are etched using the sub-gate 4c as a mask.

Next, for example, a silicon nitride film (SiN film) is formed as a second interlayer insulating film 6a containing hydrogen on the sub-gate 4a and the gate insulating film 5 by plasma CVD. A heat treatment for hydrogenation is then performed at a temperature of 410° C. or more under an $N_2$ atmosphere. Consequently, a crystal defect of the semiconductor layer is hydrogen-terminated. That is, dangling bonds at an interface of the semiconductor layer 3 or an oxide film, which are caused by dry etching etc., can be terminated by thermally-excited hydrogen, thereby improving the TFT characteristics.

The subsequent steps are identical to those of Embodiment Mode 7, and will not be further explained.

According to the above-described Embodiment Mode 8, same advantageous effect as Embodiment Mode 7 can be obtained. That is, when the heat treatment for hydrogenation is carried out by utilizing hydrogen contained in the silicon nitride film formed by plasma CVD, in order to diffuse hydrogen more easily, the heat treatment for hydrogenation is carried out after forming the silicon nitride film containing hydrogen (first interlayer insulating film 6) under the sub-gate 4c, and forming another silicon nitride film containing hydrogen (second interlayer insulating film 6a) on the sub-gate 4c. Accordingly, hydrogen contained in the first interlayer insulating film easily reaches the semiconductor layer 3. Therefore, since the hydrogen in the first interlayer insulating film is not necessary to pass through both the sub-gate and main gate, and can reach the semiconductor layer only through the main gate, the hydrogen is easily diffused into the channel region of the semiconductor layer. Consequently, the effect of the hydrogenation treatment can be improved.

When the rising characteristics of the TFT manufactured according to the present embodiment mode were measured at 100 points and a middle value of the results was compared with that of the conventional TFT, it was confirmed that the TFT of the present embodiment mode had superior rising characteristics that were equivalent to those of a TFT provided with no sub-gate.

The present invention is not exclusively limited to the above-described embodiment modes, and the embodiment modes and its details can be changed and modified without departing from the purpose and scope of the present invention. For example, the materials for the main gate, the sub-gate, the wirings, and the interlayer insulating films can be changed, properly.

Furthermore, the sub-gate 4c is formed so as to cover a part of the main gate 17, the LDD regions, the source region, and the drain region in Embodiment Mode 5 through Embodiment Mode 8. Alternatively, the sub-gate can be formed so as to cover a part of the main gate and either the LDD regions adjacent to the source region or the drain region.

Embodiment Mode 9

As an electronic device which used the semiconductor device of the invention, a video camera, a digital camera, a goggle type display (head mount display), a navigation system, an audio reproduction apparatus (car audio, audio component etc.), a notebook type personal computer, a game apparatus, a portable information terminal (mobile computer, portable telephone, portable type game machine or electronic book etc.), an image reproduction apparatus having a recording medium (concretely, apparatus which reproduces a recording medium such as Digital Versatile Disc (DVD) etc. and has a display for displaying its images) etc. are cited. A concrete example of those electronic devices will be described in FIGS. 11A to 11H.

Figure 11A:
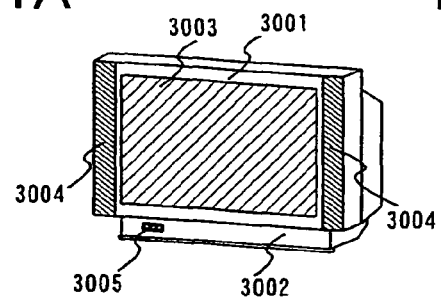
FIGS. 11A-H are views of electronic devices to which the inventions are applied.

FIG. 11A shows a display device, which includes a housing 3001, a support table 3002, a display part 3003, a speaker part 3004, a video input terminal 3005 etc. This invention can be used for the display part 3003. Also, by this invention, the display device shown in FIG. 11A is accomplished.

Figure 11B:
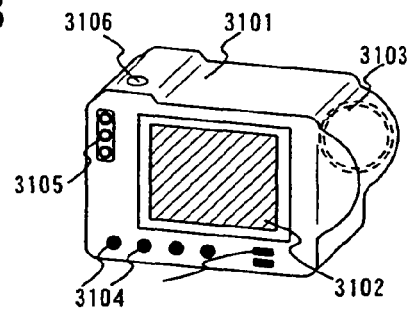

FIG. 11B shows a digital still camera, which includes a main body 3101, a display part 3102, a image reception part 3103, an operation key 3104, an external connection port 3105, a shatter 3106 etc. The invention can be used for the display part 3102. Also, by this invention, the digital still camera shown in FIG. 11B is accomplished.

Figure 11C:
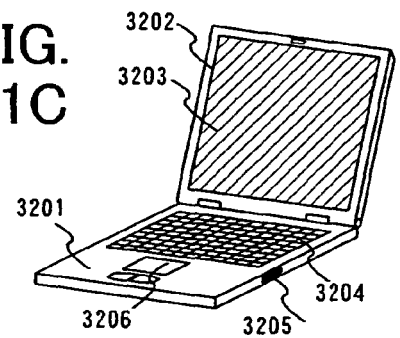

FIG. 11C shows a notebook type personal computer, which includes a main body 3201, a housing 3202, a display part 3203, a keyboard 3204, an external connection port 3205, a pointing mouse 3206 etc. This invention can be used for the display part 3203. Also, by this invention, the notebook type personal computer shown in FIG. 11C is accomplished.

Figure 11D:
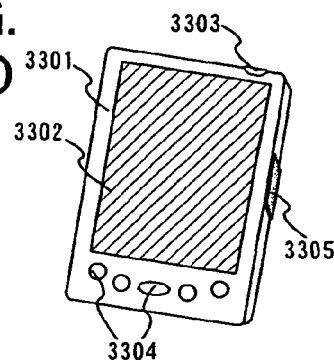

FIG. 11D shows a mobile computer, which includes a main body 3301, a display part 3302, a switch 3303, an operation key 3304, an infrared port 3305 etc. This invention can be used for the display part 3302. Also, by this invention, the mobile computer shown in FIG. 11D is accomplished.

Figure 11E:
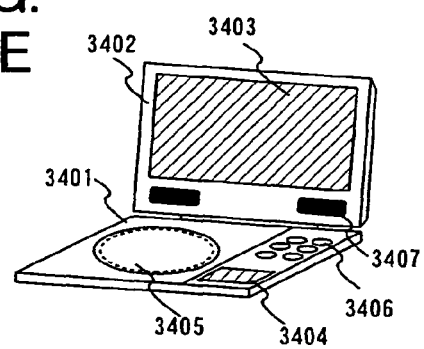

FIG. 11E shows a portable type image reproduction apparatus having a recording medium (concretely, DVD reproduction apparatus), which includes a main body 3401, a housing 3402, a display part A 3403, a display part B 3404, a recording medium (DVD etc.) reading part 3405, an operation key 3406, a speaker part 3407. The display part A 3403 mainly displays image information, and the display part B 3404 mainly displays character information and, this invention can be used for the display parts A, B 3403, 3404. In addition, the image reproduction apparatus having the recording medium includes a home use game machine etc. Also, by this invention, the DVD reproduction apparatus shown in FIG. 11E is accomplished.

Figure 11F:
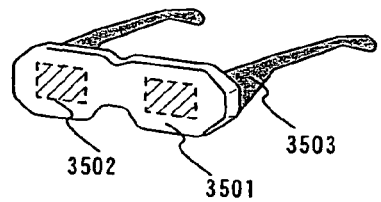

FIG. 11F shows a goggle type display (head mount display), which includes a main body 3501, a display part 3502, and an arm part 3503. This invention can be used for the display part 3502. Also, by this invention, the goggle type display shown in FIG. 11F is accomplished.

Figure 11G:
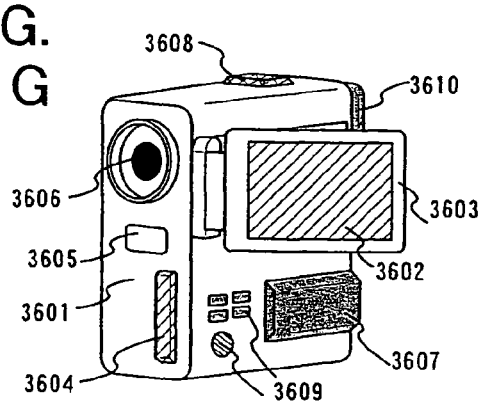

FIG. 11G shows a video camera, which includes a main body 3601, a display part 3602, a housing 3603, an external connection port 3604, a remote control reception part 3605, a image reception part 3606, a battery 3607, a sound input part 3608, an operation key 3609 etc. This invention can be used for the display part 3602. Also, by this invention, the video camera shown in FIG. 11G is accomplished.

Figure 11H:
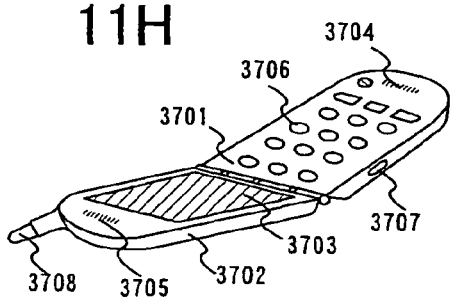

FIG. 11H shows a portable telephone, which includes a main body 3701, a housing 3702, a display part 3703, a sound input part 3704, a sound output part 3705, an operation key 3706, an external connection port 3707, an antenna 3708 etc. This invention can be used for the display part 3703. In addition, by displaying white characters against a black background, it is possible to suppress electric current consumption of the portable telephone. Also, by this invention, the portable telephone shown in FIG. 11H is accomplished.

As described above, an applicable scope of the invention is extremely wide, and it is possible to use it for electronic devices in every fields. Also, a semiconductor device of any structure shown in the Embodiment modes 1 to 8 may be used for the electronic device of this embodiment mode.

What is claimed is:

1. A semiconductor device comprising:
    a source region and a drain region formed in a semiconductor layer;
    a plurality of LDD regions formed adjacent to the inside of the source region and the drain region in the semiconductor layer;
    a gate insulating film formed over the semiconductor layer;
    a main gate formed over the gate insulating film;
    a sub-gate formed over the main gate and the gate insulating film so as to cover a top surface and a corner of the main gate, the sub-gate being partly opened on the top surface or a side surface of the main gate; and
    an interlayer insulating film containing hydrogen formed over the sub-gate, the main gate, and the gate insulating film,
    wherein the sub-gate is in direct contact with the gate insulating film, and
    wherein the sub-gate overlaps each of the plurality of LDD regions.

2. An electronic device having the semiconductor device according to claim 1, wherein said electronic device is selected from the group consisting of a display device, a digital still camera, a lap-top computer, a mobile computer, a portable image reproduction apparatus, a goggle type display, a video camera, and a mobile telephone.

* * * * *